United States Patent
Zhang

(10) Patent No.: US 12,361,851 B2
(45) Date of Patent: Jul. 15, 2025

(54) GATE DRIVE CIRCUIT AND DISPLAY PANEL

(71) Applicant: WUHAN CHINA STAR OPTOELECTRONICS SEMICONDUCTOR DISPLAY TECHNOLOGY CO., LTD., Wuhan (CN)

(72) Inventor: Huanxi Zhang, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 18/519,000

(22) Filed: Nov. 26, 2023

(65) Prior Publication Data

US 2025/0054428 A1    Feb. 13, 2025

(30) Foreign Application Priority Data

Aug. 10, 2023   (CN) .......................... 202311008361.6

(51) Int. Cl.
*G09G 3/20* (2006.01)
*G11C 19/28* (2006.01)

(52) U.S. Cl.
CPC .............. *G09G 3/20* (2013.01); *G11C 19/28* (2013.01); *G09G 2300/0413* (2013.01); *G09G 2300/0819* (2013.01); *G09G 2300/0852* (2013.01); *G09G 2310/0267* (2013.01); *G09G 2310/0286* (2013.01); *G09G 2310/08* (2013.01); *G09G 2320/0247* (2013.01); *G09G 2320/045* (2013.01)

(58) Field of Classification Search
CPC ............ G09G 3/20; G09G 2300/0413; G09G 2300/0819; G09G 2300/0852; G09G 2310/0267; G09G 2310/0286; G09G 2310/08; G09G 2320/0247; G09G 2320/045; G11C 19/28
See application file for complete search history.

(56) References Cited

U.S. PATENT DOCUMENTS

2010/0079169 A1*  4/2010  Kim ..................... H01L 27/1203
                                                                        326/120
2017/0124976 A1*  5/2017  Chen ..................... G09G 3/3677

* cited by examiner

*Primary Examiner* — Towfiq Elahi
(74) *Attorney, Agent, or Firm* — The Roy Gross Law Firm, LLC; Roy D. Gross

(57) ABSTRACT

The present disclosure discloses a gate drive circuit and a display panel. The gate drive circuit includes a plurality of shift registers. An Nth-stage shift register of the plurality of shift registers includes a stage transmission signal selection module, a pull-up control module, a first filter module, a second filter module, a first output module, a first inverting module, an isolation module, or a second output module.

12 Claims, 13 Drawing Sheets

GATE DRIVE CIRCUIT AND DISPLAY PANEL

CROSS-REFERENCE TO RELATED APPLICATIONS

This application claims priority to Chinese Patent Application No. 202311008361.6 filed on Aug. 10, 2023. The disclosure of the aforementioned application is incorporated herein by reference in its entirety.

TECHNICAL FIELD

The present disclosure relates to the field of display technologies, and in particular, to a gate drive circuit and a display panel.

BACKGROUND

In a display panel, a gate drive circuit usually provides a needed gate drive signal to a corresponding transistor in a pixel circuit.

However, threshold voltages of some transistors in the gate drive circuit shift. This not only limits ranges of the threshold voltages of these transistors, but also cause stability of a pulse amplitude of the gate drive signal provided by the gate drive circuit to be reduced. Therefore, this becomes one of causes for improving the gate drive circuit.

SUMMARY

The present disclosure provides a gate drive circuit and a display panel, to alleviate a technical problem that shift of a threshold voltage of a transistor limits a range of the threshold voltage and reduces stability of a pulse amplitude of a gate drive signal.

According to a first aspect, the present disclosure provides a gate drive circuit. The gate drive circuit includes a plurality of shift registers. Each of the plurality of shift registers includes a stage transmission signal selection module, a pull-up control module, a first filter module, a second filter module, a first output module, a first inverting module, an isolation module, and a second output module. The stage transmission signal selection module is electrically connected between a first node and a first wire. The pull-up control module controls a potential of a second node based on a potential of the first node and a potential of a first clock signal. The first filter module is electrically connected between the second node and a third node. A control end of the first filter module receives a reset signal. The second filter module is electrically connected between the first filter module and the third node. A control end of the second filter module receives a filter control signal. The first output module outputs a corresponding first gate drive signal based on a potential of the third node and a potential of a fourth node. The first inverting module is electrically connected between the second node and the fourth node. The isolation module is connected between the second node and a fifth node in series. A control end of the isolation module receives the first clock signal. The second output module includes a first transistor and a second transistor. A first electrode of the first transistor is electrically connected to a high potential line. A gate of the first transistor is electrically connected to the fifth node. A second electrode of the first transistor outputs a corresponding second gate drive signal. The first transistor is a P-channel transistor. The second transistor is an N-channel transistor. A first electrode of the second transistor is electrically connected to the second electrode of the first transistor. A second electrode of the second transistor is electrically connected to a low potential line. A top gate of the second transistor is electrically connected to the fifth node. A bottom gate of the second transistor receives a voltage signal smaller than a potential of the fifth node.

According to a second aspect, the present disclosure provides a display panel. The display panel includes a pixel circuit and the gate drive circuit according to at least one of the foregoing implementations. The pixel circuit includes a write transistor controlling input of a data signal and a compensation transistor controlling the data signal to be input into a gate of a drive transistor. An output end of the first output module is electrically connected to a gate of the write transistor. An output end of the second output module is electrically connected to a gate of the compensation transistor.

In the gate drive circuit and the display panel provided in the present disclosure provides, by receiving a voltage signal smaller than a potential of the top gate of a second transistor on a bottom gate of the second transistor, a threshold voltage of the second transistor may be adjusted to bias positively. Not only does the threshold voltage of the second transistor obtain a large range of positive bias, and limitation on a range of the threshold voltage of the second transistor is lifted, but on-state current of the second transistor in a turn-off state is reduced, so that a high potential of a second gate drive signal output by the second output module is improved and stabilized.

BRIEF DESCRIPTION OF THE DRAWINGS

The following describes specific implementations of the present disclosure in detail with reference to the accompanying drawings, to make the technical solutions and other beneficial effects of the present disclosure clear.

DETAILED DESCRIPTION

The technical solutions of the embodiments of the present disclosure are clearly and completely described below with reference to the accompanying drawings of the embodiments of the present disclosure. Apparently, the described embodiments are merely some but not all of the embodiments of the present disclosure. All other embodiments obtained by a person skilled in the art based on the embodiments of the present disclosure without creative efforts shall fall within the protection scope of the present disclosure.

In addition, terms "first" and "second" are used merely for the purpose of description, and shall not be as indicating or implying relative importance or implying a quantity of indicated technical features. Therefore, a feature restricted by "first" or "second" may explicitly indicate or implicitly include one or more such features. In description of the present invention, "a plurality of" means two or more unless it is specifically defined otherwise.

In a gate drive circuit in the patent application with Application No. 202310191137.9, an Nth-stage negative pulse gate drive signal Pout[N] has one negative pulse in one frame. An Nth-stage positive pulse gate drive signal Nout[N] has two positive pulses in one frame, and pulse widths of the two positive pulses must be equal and both are 2H. This limits that widths of the positive pulses of the Nth-stage positive pulse gate drive signal Nout[N] must be consistent and cannot be changed, so that when the widths of the positive pulses of the Nth-stage positive pulse gate drive signal Nout[N] are greater than 2H, a quantity of negative pulses of the Nth-stage negative pulse gate drive signal Pout[N] in one frame increases.

Figure 1:
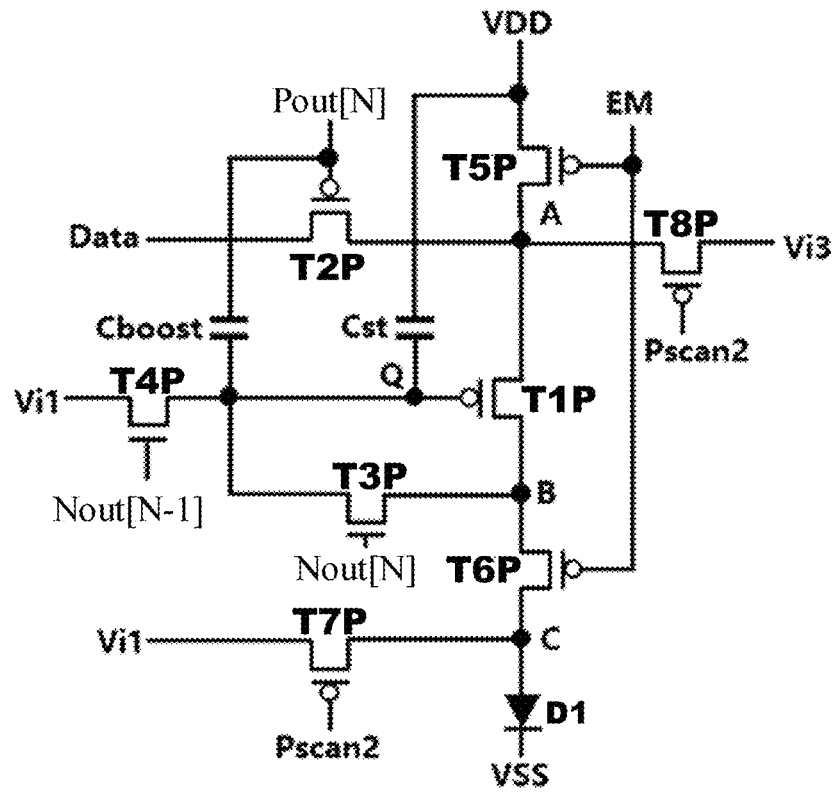
FIG. 1 is a schematic diagram of a structure of a pixel circuit in the conventional technology.
Figure 2:
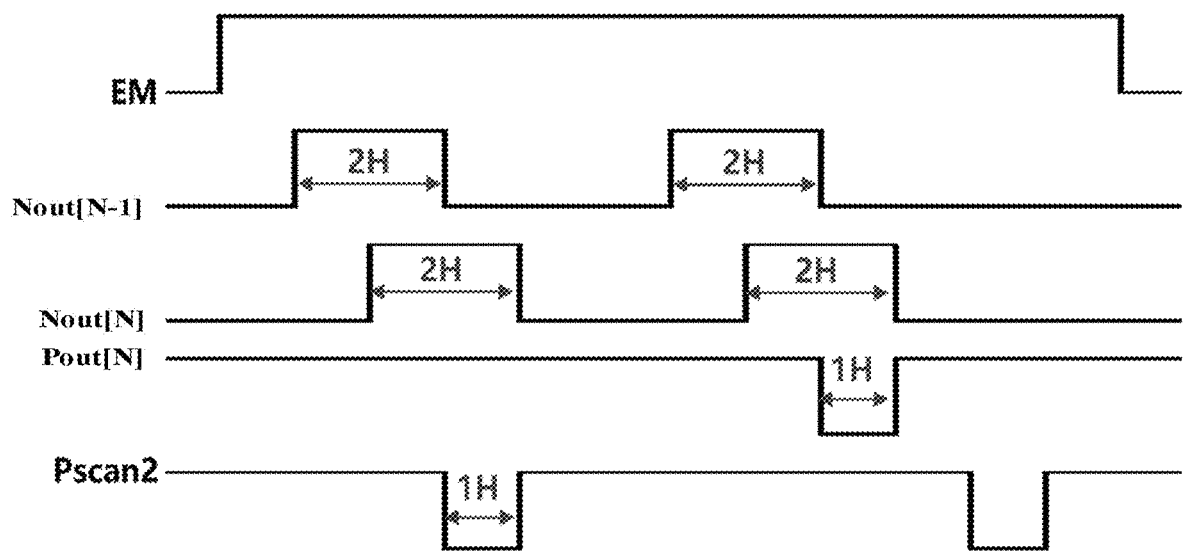
FIG. 2 is a schematic diagram of timing of the pixel circuit in FIG. 1.

Therefore, this limits the pixel circuit shown in FIG. 1 to work based on the timing shown in FIG. 2. Specifically, the pixel circuit shown in FIG. 1 may include at least one of a write transistor T2P, a drive transistor T1P, a first light-emitting control transistor T5P, a second light-emitting control transistor T6P, a first initialization transistor T4P, a second initialization transistor T7P, a third initialization transistor T8P, a compensation transistor T3P, a light-emitting device D1, a storage capacitor Cst, or a bootstrap capacitor CbOst.

A first power line is electrically connected to a first electrode of the first light-emitting control transistor T5P and an end of the storage capacitor Cst. A second electrode of the first light-emitting control transistor T5P is electrically connected to a first electrode of the drive transistor T1P and a first electrode of the write transistor T2P. A second electrode of the drive transistor T1P is electrically connected to a first electrode of the compensation transistor T3P and a first electrode of the second light-emitting control transistor T6P. A second electrode of the second light-emitting control transistor T6P is electrically connected to a first electrode of the second initialization transistor T7P and an anode of the light-emitting device D1. A cathode of the light-emitting device D1 is electrically connected to a second power line.

A light-emitting control line is electrically connected to a gate of the first light-emitting control transistor T5P and a gate of the second light-emitting control transistor T6P.

A second electrode of the write transistor T2P is electrically connected to a data line. A gate of the write transistor T2P is electrically connected to an end of the bootstrap capacitor CbOst, and receives the Nth-stage negative pulse gate drive signal Pout[N]. A second electrode of the second initialization transistor T7P is electrically connected to a second initialization line. A gate of the second initialization transistor T7P receives a gate drive signal Pscan2.

A second electrode of the compensation transistor T3P is electrically connected to a gate of the drive transistor T1P. A gate of the compensation transistor T3P receives the Nth-stage positive pulse gate drive signal Nout[N].

The gate of the drive transistor T1P is electrically connected to the other end of the storage capacitor Cst, the other end of the bootstrap capacitor CbOst, and a first electrode of the first initialization transistor T4P.

A second electrode of the first initialization transistor T4P is electrically connected to a first initialization line. A gate of the first initialization transistor T4P receives an (N−1)th-stage positive pulse gate drive signal Nout[N−1].

A first electrode of the third initialization transistor T8P is electrically connected to the first electrode of the drive transistor T1P. A second electrode of the third initialization transistor T8P is electrically connected to a third initialization line. A gate of the third initialization transistor T8P and the gate of the second initialization transistor T7P share the gate drive signal Pscan2.

It should be noted that the second initialization line may alternatively be replaced by the first initialization line. In this way, one trace required for the pixel circuit may be reduced to increase density of pixel circuits in a display panel.

In the present disclosure, the first electrode may be one of a source or a drain, and the second electrode may be the other of the source or the drain. For example, when the first electrode is a source, the second electrode is a drain. Alternatively, when the first electrode is a drain, the second electrode is a source.

The first power line is configured to transmit a positive power signal VDD, and the second power line is configured to transmit a negative power signal VSS. A potential of the positive power signal VDD is higher than a potential of the negative power signal VSS. The data line is configured to transmit a data signal Data. The light-emitting control line is configured to transmit a light-emitting control signal EM. The first initialization line is configured to transmit a first initialization signal Vi1. The second initialization line is configured to transmit a second initialization signal. The third initialization line is configured to transmit a third initialization signal Vi3. A first gate drive line is configured to transmit the Nth-stage negative pulse gate drive signal Pout[N]. Second gate drive lines connected to shift registers with different stages are respectively configured to transmit the (N−1)th-stage positive pulse gate drive signal Nout[N−1] and the Nth-stage positive pulse gate drive signal Nout[N].

It may be learned from the foregoing descriptions that in the gate drive circuit shown in the patent application with Application No. 202310191137.9, a principle of generating a negative pulse of the Nth-stage negative pulse gate drive signal Pout[N] in one frame is formed by filtering out a first pulse of a start control signal STV or an (N−Y)th-stage positive pulse gate drive signal Nout[N−Y] by using a second pulse of a reset signal RST. Therefore, widths of two positive pulses of the start control signal STV or the (N−Y)th-stage positive pulse gate drive signal Nout[N−Y] must be equal.

In the pixel circuit shown in FIG. 1, to turn on the compensation transistor T3P and the first initialization transistor T4P synchronously, a pulse of the (N−1)th-stage positive pulse gate drive signal Nout[N−1] needs to partially overlap a pulse of the Nth-stage positive pulse gate drive signal Nout[N]. This is also a cause why the first initialization transistor T4P in the pixel circuit shown in FIG. 1 must receive the (N−1)th-stage positive pulse gate drive signal Nout[N−1].

In addition, to complete transmission of the third initialization signal Vi3 to a node Q sequentially through a node A and a node B, to reset potentials of the node A, the node B, and the node Q, the third initialization transistor T8P and the compensation transistor T3P need to be turned on synchronously. A pulse of the gate drive signal Pscan2 needs to partially overlap the pulse of the Nth-stage positive pulse gate drive signal Nout[N].

However, to enable the pixel circuit shown in FIG. 1 to continue to use the gate drive signal Pscan2 with a pulse width of only 1H, drive timing of the pixel circuit shown in FIG. 2 needs to be adjusted. Correspondingly, the gate drive circuit shown in FIG. 1 also needs to be improved.

Figure 3:
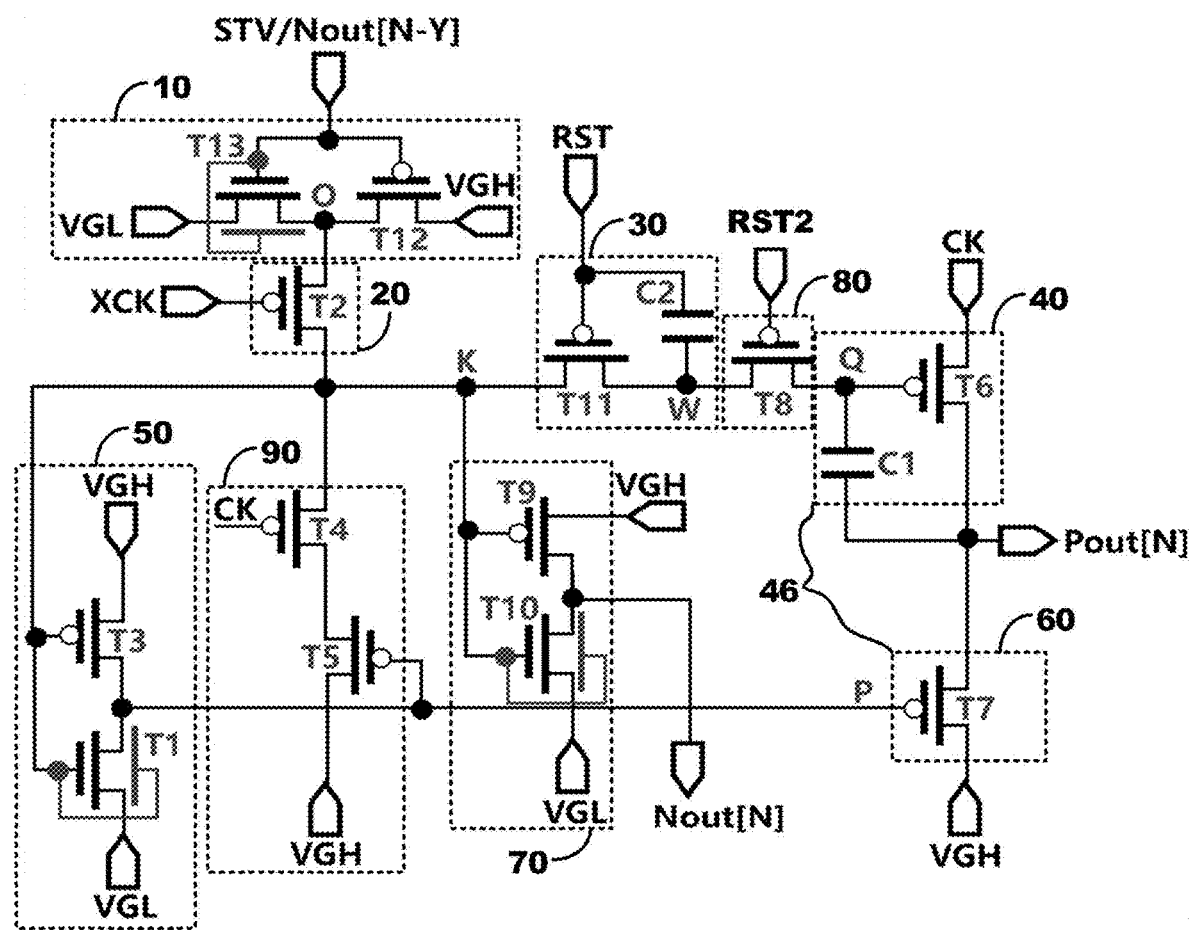
FIG. 3 is a schematic diagram of a first structure of a gate drive circuit in the conventional technology.
Figure 4:
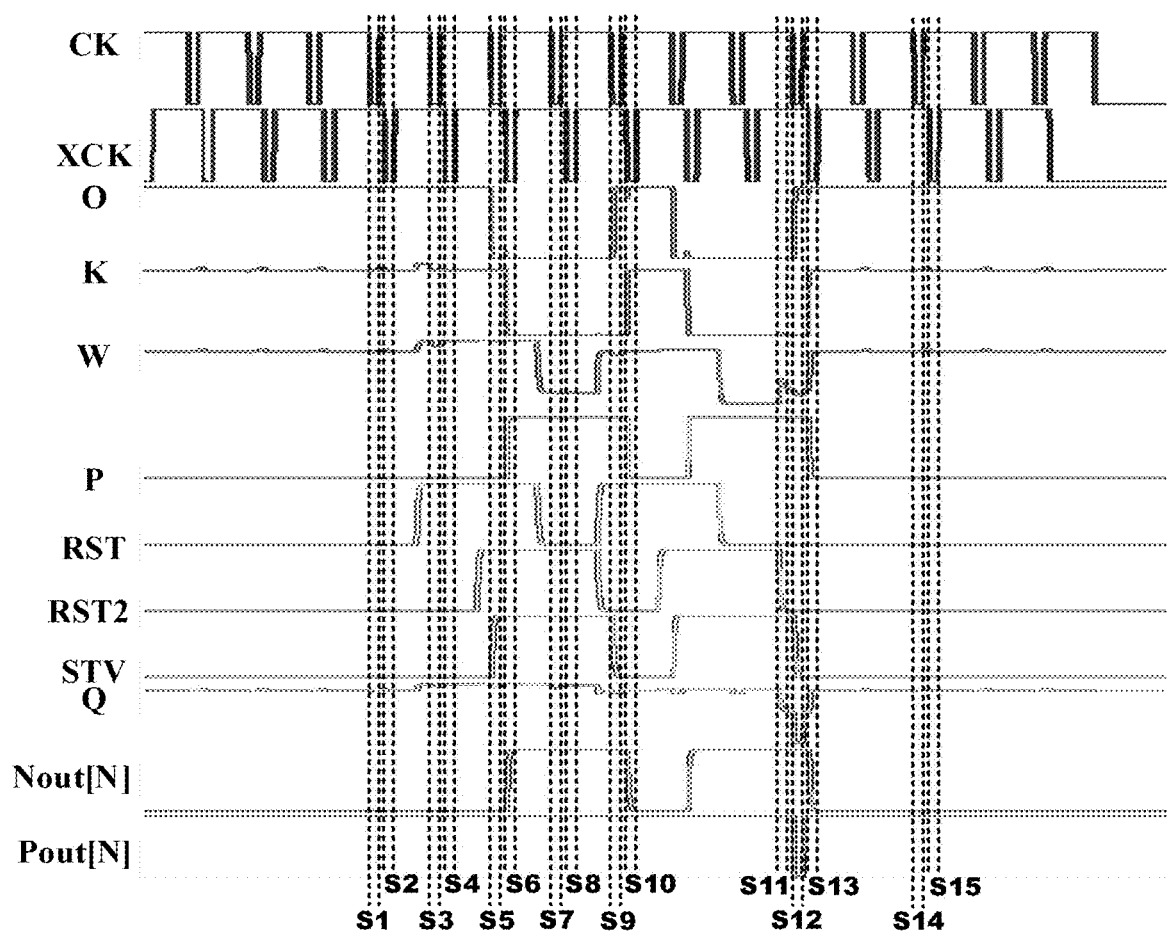
FIG. 4 is a schematic diagram of timing of the gate drive circuit shown in FIG. 3.

In the context, to alleviate a technical problem that the pulse of the gate drive signal is difficult to apply in terms of time and width, the gate drive circuit shown in FIG. 3 is used. The gate drive circuit may work based on the timing shown in FIG. 4. A detailed description of the gate drive circuit refers to the patent application with Application NO. 202310922942.4.

Figure 5:
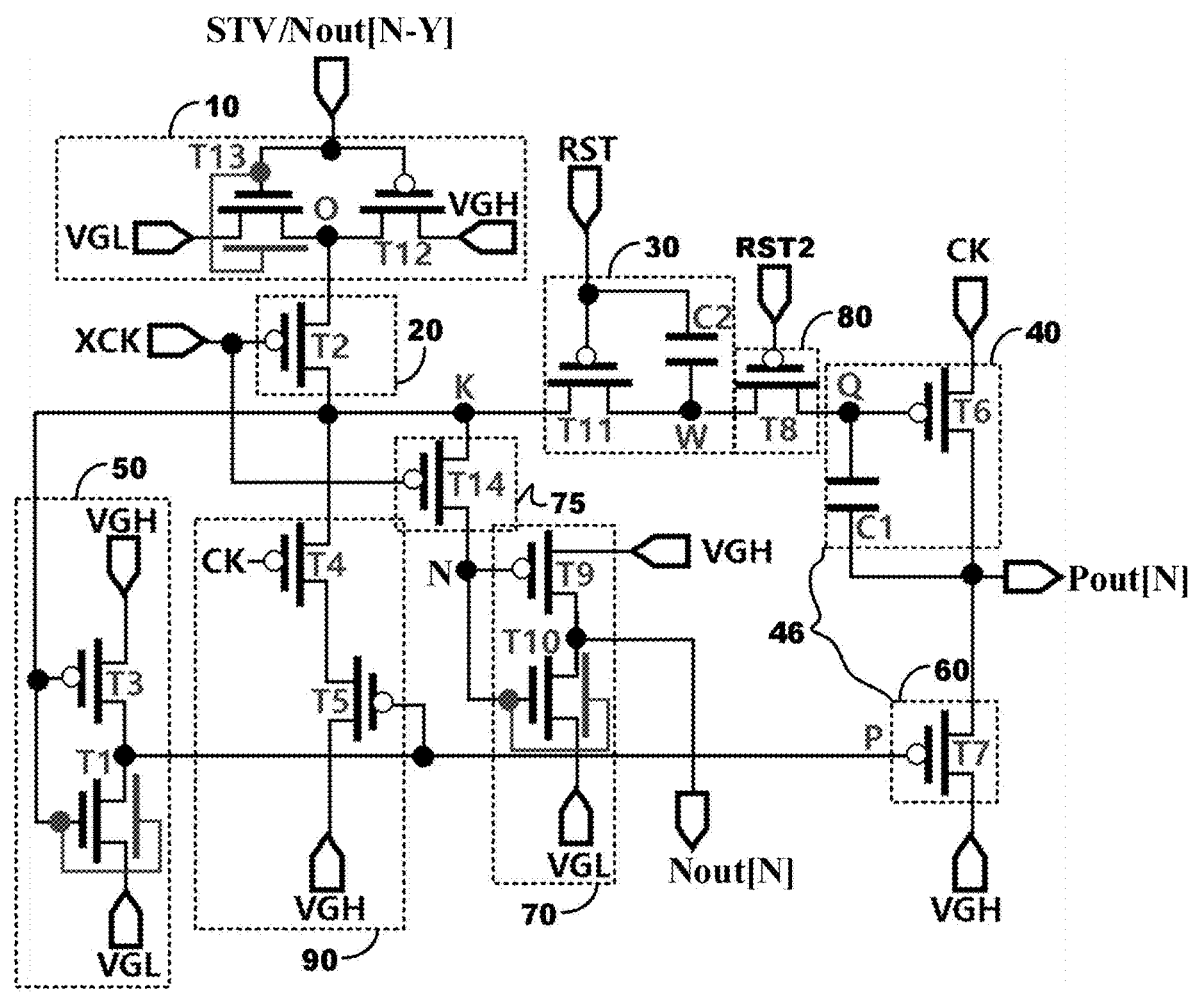
FIG. 5 is a schematic diagram of a second structure of a gate drive circuit in the conventional technology.
Figure 6:
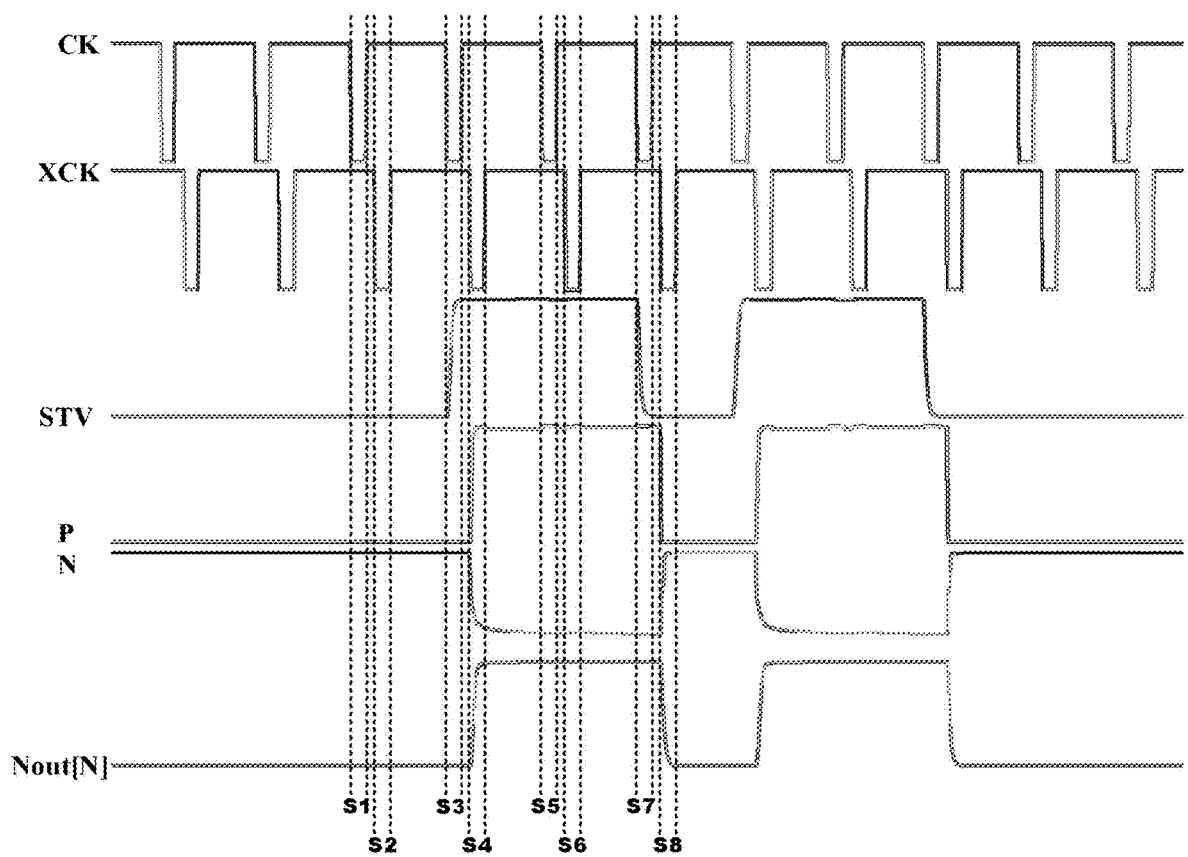
FIG. 6 is a schematic diagram of timing of the gate drive circuit shown in FIG. 5.

However, to overcome coupling impact of the Nth-stage negative pulse gate drive signal Pout[N] on the gate drive circuit shown in FIG. 3 when the Nth-stage positive pulse gate drive signal Nout[N] outputs a high potential, the gate drive circuit shown in FIG. 5 is used. The gate drive circuit may work based on the timing shown in FIG. 6. A detailed description of the gate drive circuit also refers to the patent application with Application NO. 202310922942.4.

Figure 7:
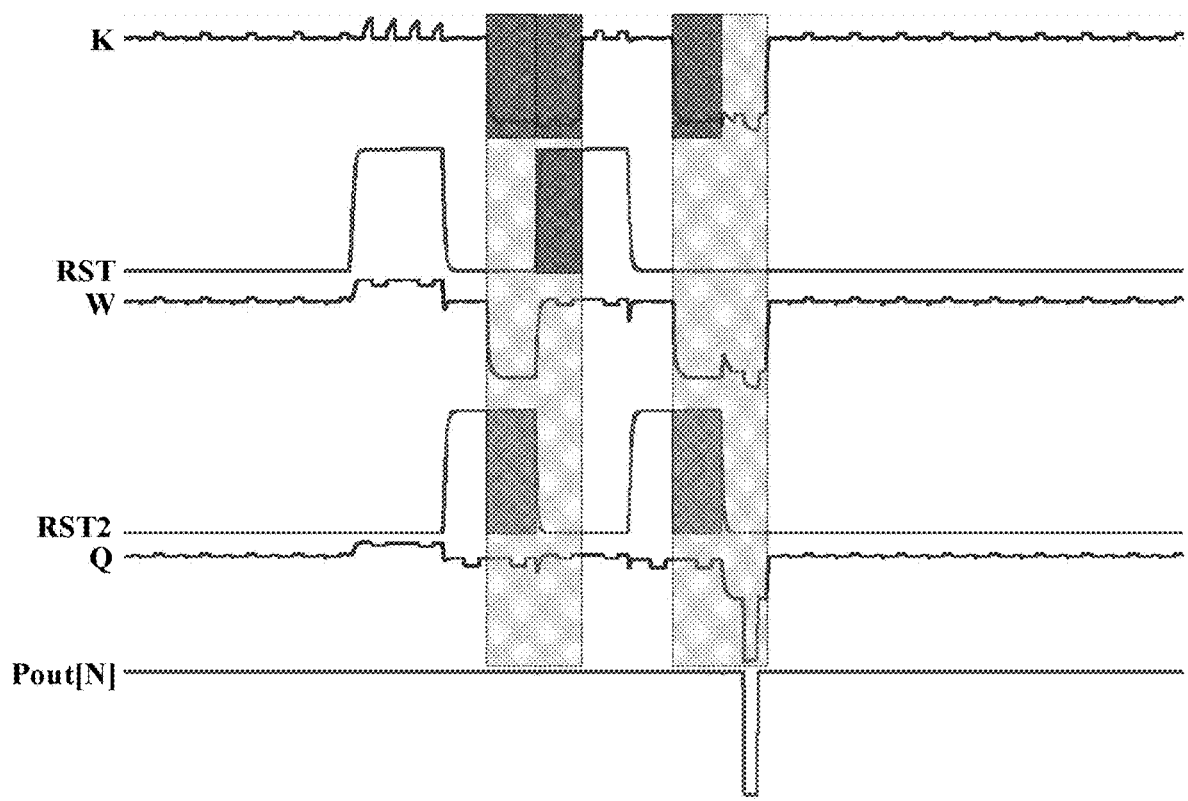
FIG. 7 is a schematic diagram of timing of a generated Nth-stage negative pulse gate drive signal according to an embodiment of the present disclosure.

According to the records of the patent application with Application NO. 202310922942.4, it may be learned that FIG. 7 shows a process of generating negative pulses of the Nth-stage negative pulse gate drive signal Pout[N]. To describe clearly, two pulses from right to left in a same signal are referred to as a first pulse and a second pulse in sequence. A second node K transmits a first pulse and a second pulse successively in one frame. High potentials of a former part of two pulses of an (N−2)th-stage positive pulse gate drive signal Nout[N−2] controls a second filter module 80 to filter out a latter part of a first pulse and a latter part of a second pulse output by the second node K. A high potential of a latter part of a first pulse of the reset signal RST controls a first filter module 30 to filter out a former part of the second pulse output by the second node K. In this way, a width of a second pulse of a node W also becomes narrow. The second pulse output by the second node K is completely filtered out, and only the former part of the first pulse output by the second node K is left to form a negative pulse at a third node Q. The negative pulse of the third node Q enables a pull-up module 40. A negative pulse of the Nth-stage negative pulse gate drive signal Pout[N] with a fixed width is formed.

Figure 8:
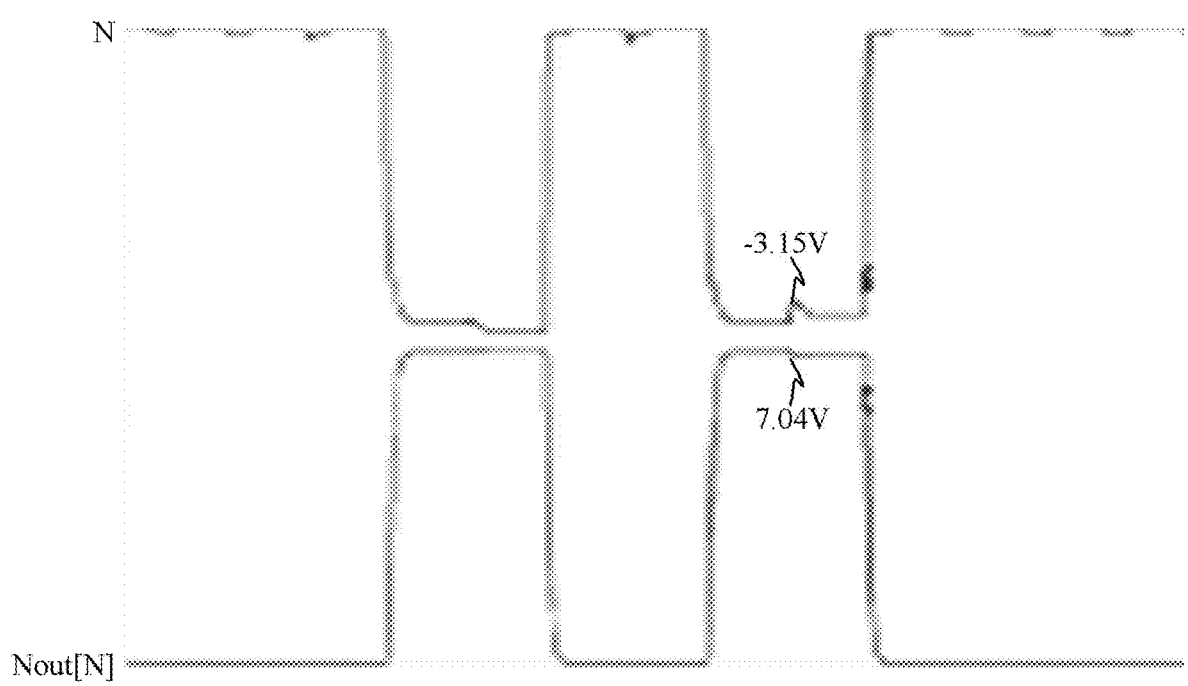
FIG. 8 is a schematic diagram of a potential of some nodes in the gate drive circuit shown in FIG. 5.

FIG. 8 is a schematic diagram of waveforms of a fifth node N and the second gate drive signal, namely, the Nth-stage positive pulse gate drive signal Nout[N] in FIG. 5. For example, when a low potential signal VGL is set to −8 V, and a voltage of the fifth node N is −3.15 V, as a gate-source voltage difference of a second transistor T10 made of indium gallium zinc oxide, namely Vgs=4.85 V. At this time, the second transistor T10 is in an ON state, and low leakage current is output. A high stage output by the Nth-stage positive pulse gate drive signal Nout[N] is determined by a high potential signal VGH and the low potential signal VGL together. Therefore, after a threshold voltage, namely, Vth, of the second transistor T10 shifts (shift) negatively, the leakage current of the second transistor T10 increases, and the high potential of the Nth-stage positive pulse gate drive signal Nout[N] drops to 7.04 V. The threshold voltage of the second transistor T10 shifts negatively, causing the threshold voltage of the second transistor T10 to be unable to obtain a large positive threshold voltage. This not only seriously limits a workable range of the threshold voltage of the second transistor T10, but also causes output of the high potential of the Nth-stage positive pulse gate drive signal Nout[N] abnormal.

Figure 9:
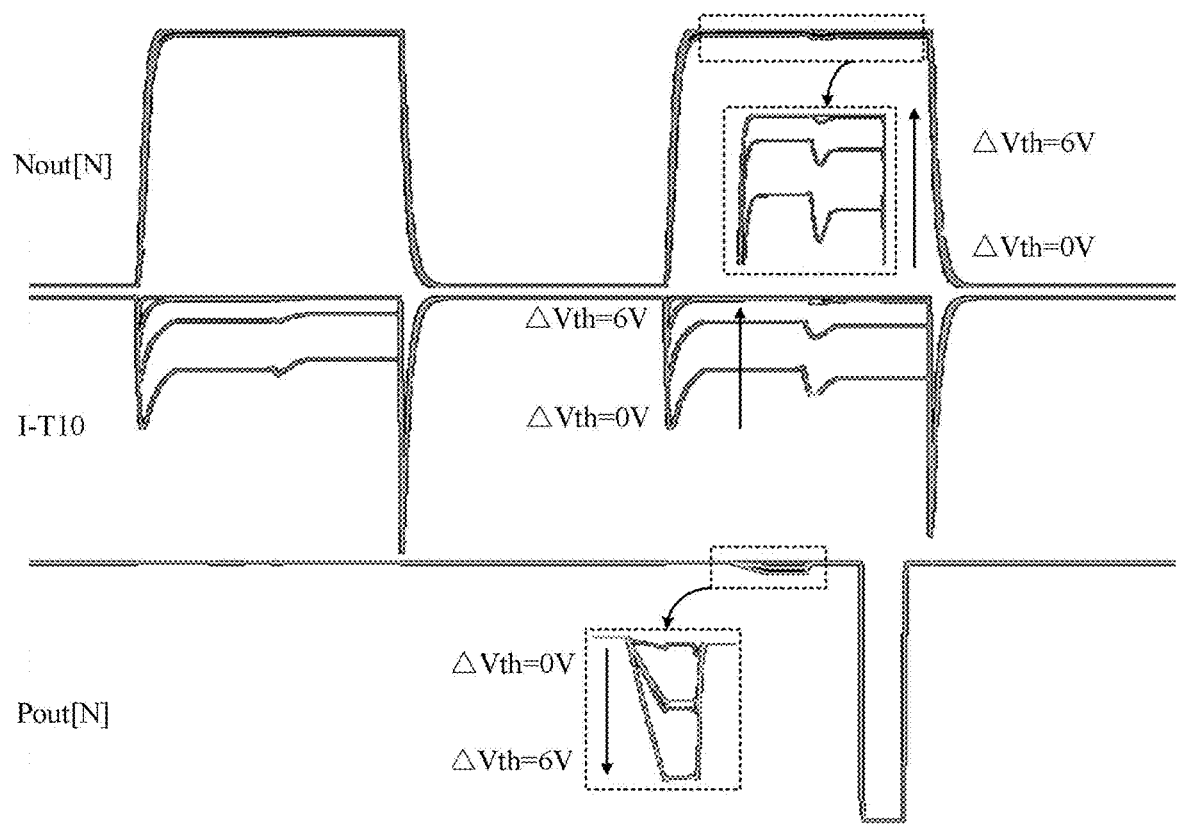
FIG. 9 is a schematic diagram of impact of shift of a threshold voltage of a second transistor in the gate drive circuit shown in FIG. 5 on output.

Specifically, as shown in FIG. 9, when the high potential of the Nth-stage positive pulse gate drive signal Nout[N] outputs, as the threshold voltage of the second transistor T10 decreases gradually, in other words, a process of $\Delta Vth=6$ V to $\Delta Vth=0$ V, leakage current or on-state current, namely, I-T10, flowing through the second transistor T10 becomes larger, the high potential of the Nth-stage positive pulse gate drive signal Nout[N] decreases more, and impact of stability of the high potential of the Nth-stage negative pulse gate drive signal Pout[N] becomes smaller.

Figure 10:
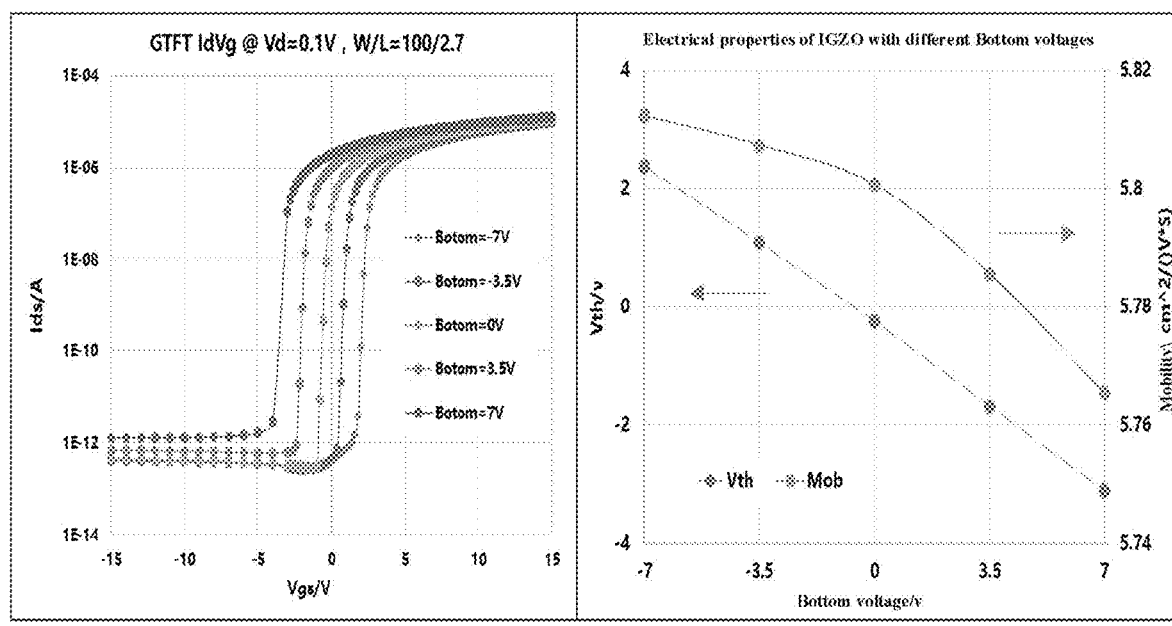
FIG. 10 is a schematic diagram of a relationship between electrical parameters of transistors according to an embodiment of the present disclosure.

It is found through a study about an electrical result of a double-gate indium gallium zinc oxide (IGZO) thin film transistor, as shown in FIG. 10, after the threshold voltage, namely, Vth, is positively biased, a drain-source current, namely, Ids, in same gate-source voltage difference, namely, Vgs becomes smaller. A lower Bottom (bottom gate) voltage applied by a bottom gate indicates a higher voltage Vth, and mobility (Mobility) does not be changed much.

Figure 11:
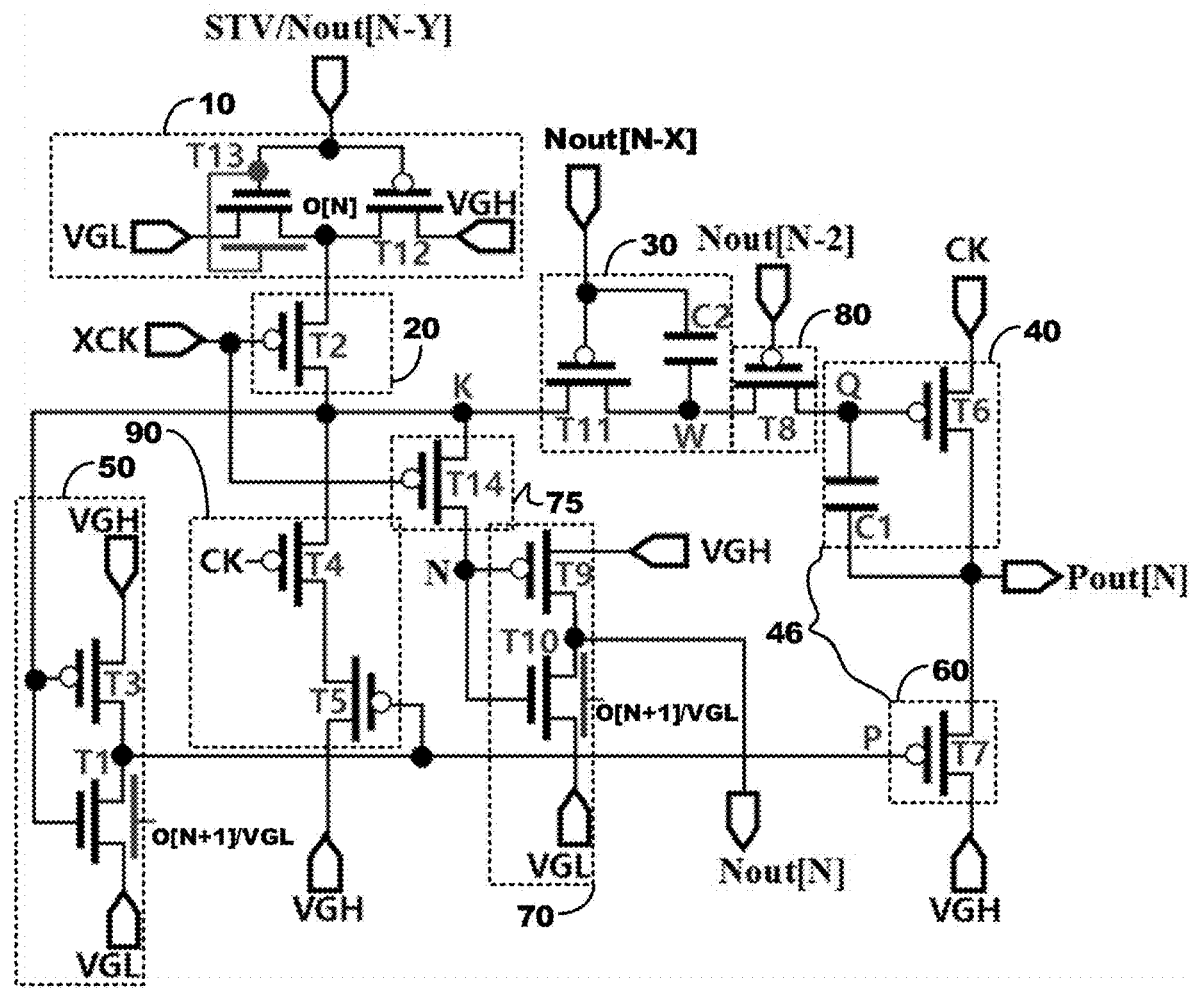
FIG. 11 is a schematic diagram of a structure of a gate drive circuit according to an embodiment of the present disclosure.

Based on the foregoing analysis, the present embodiment provides a gate drive circuit. As shown in FIG. 11, the gate drive circuit includes a plurality of shift registers. Each shift register includes at least one of a stage transmission signal selection module 10, a pull-up control module 20, a first filter module 30, a second filter module 80, a first output module 46, a first inverting module 50, an isolation module 75, or a second output module 70.

The stage transmission signal selection module 10 is electrically connected between a first node O[N] and a first wire. The first wire may be a start control line or an (N−Y)th-stage positive pulse gate drive line. Y is an integer greater than or equal to 1.

The pull-up control module 20 controls a potential of a second node K based on a potential of the first node O[N] and a potential of a first clock signal XCK.

The first filter module 30 is electrically connected between the second node K and a third node Q. A control end of the first filter module 30 receives a reset signal RST. The reset signal RST may be an (N−X)th-stage positive pulse gate drive signal Nout[N−X] or the other adapted positive pulse signal. The (N−X)th-stage positive pulse gate drive signal Nout[N−X] may be transmitted by an (N−X)th-stage positive pulse gate drive line. X is an integer greater than or equal to 2.

The second filter module 80 is electrically connected between the first filter module 30 and the third node Q. A control end of the second filter module 80 receives a filter control signal RST2. The filter control signal RST2 may be the other positive pulse gate drive signal, for example, an (N−2)th-stage positive pulse gate drive signal Nout[N−2] and an (N−3)th-stage positive pulse gate drive signal Nout[N−3].

The first output module 46 outputs a corresponding first gate drive signal based on a potential of the third node Q and a potential of a fourth node P.

The first inverting module 50 is electrically connected between the second node K and the fourth node P.

The isolation module 75 is connected between the second node K and a fifth node N in series. A control end of the isolation module 75 receives the first clock signal XCK.

The second output module 70 includes a first transistor T9 and a second transistor T10. A first electrode of the first transistor T9 is electrically connected to a high potential line. A gate of the first transistor T9 is electrically connected to the fifth node N. A second electrode of the first transistor T9 outputs a corresponding second gate drive signal. The first transistor T9 is a P-channel transistor.

The second transistor T10 is an N-channel transistor. A first electrode of the second transistor T10 is electrically connected to the second electrode of the first transistor T9. A second electrode of the second transistor T10 is electrically connected to a low potential line. A top gate of the second transistor T10 is electrically connected to the fifth node N. A bottom gate of the second transistor T10 receives a voltage signal smaller than a potential of the fifth node N.

It may be understood that in the gate drive circuit provided in the present embodiment, by receiving a voltage signal smaller than a potential of the top gate of the second transistor T10 on the bottom gate of the second transistor T10, a threshold voltage of the second transistor T10 may be adjusted to bias positively. Not only does the threshold voltage of the second transistor T10 obtain a large range of positive bias, and limitation on a range of the threshold voltage of the second transistor T10 is lifted, but on-state current of the second transistor T10 in a turn-off state is reduced, so that a high potential of a second gate drive signal output by the second output module 70 is improved and stabilized.

It should be noted that compared with the gate drive circuit shown in FIG. 5, in the gate drive circuit shown in FIG. 11, the bottom gate of the second transistor T10 is not connected to the top gate of the second transistor T10, but independently receives a voltage signal with a potential lower than the potential of the top gate of the second transistor T10.

In an embodiment, the voltage signal is used for adjusting a threshold voltage of the second transistor T10 to bias positively. This can not only reduce leakage current, but improve and stabilize a high potential output by the second output module 70.

In an embodiment, the voltage signal is further used for adjusting the threshold voltage of the second transistor T10 to be greater than 0 V. This may further define a range of positive bias of the threshold voltage of the second transistor T10, so that the leakage current can be further reduced, and the high potential output by the second output module 70 can be further improved and stabilized.

In an embodiment, the voltage signal is a constant-voltage signal, or the voltage signal has two negative pulses in one frame.

It should be noted that when the second transistor T10 is in a turn-off state, the potential of the fifth node N is a negative potential, so that a potential of the voltage signal in the present embodiment is lower than a negative potential of the fifth node N. The threshold voltage of the second transistor T10 may be adjusted to bias positively. This can not only reduce the leakage current, but improve and stabilize the high potential output by the second output module 70.

In an embodiment, when the voltage signal is a constant-voltage signal, the voltage signal originates from the low potential line.

It should be noted that a low potential signal VGL with a fixed voltage in the low potential line can also reduce the leakage current, and can further improve and stabilize the high potential output by the second output module 70. In addition, the low potential line may be further shared, and a quantity of traces of the gate drive circuit can be reduced.

In an embodiment, when the voltage signal has two negative pulses in one frame, the voltage signal originates from the second node K or a first node, namely, O[N+1], in a next-stage shift register.

It should be noted that under control of a potential of the second node K with two negative pulses or the first node, namely, O[N+1], in the next-stage shift register, the leakage current can also be reduced, and the high potential output by the second output module 70 can be further improved and stabilized. In addition, the second node K or the first node, namely, O[N+1], in the next-stage shift register may be further shared, and a quantity of external traces of the gate drive circuit can be reduced.

In an embodiment, the first inverting module 50 includes a third transistor T3 and a fourth transistor T1. A first electrode of the third transistor T3 is electrically connected to the high potential line. A gate of the third transistor T3 is electrically connected to the second node K. A second electrode of the third transistor T3 is electrically connected to the fourth node P. The third transistor T3 is a P-channel transistor. The fourth transistor T1 is an N-channel transistor. A first electrode of the fourth transistor T1 is electrically connected to the second electrode of the third transistor T3. A second electrode of the fourth transistor T1 is electrically connected to the low potential line. A top gate of the fourth transistor T1 is electrically connected to the second node K. A bottom gate of the fourth transistor T1 receives a voltage signal smaller than the potential of the second node K.

It should be noted that by receiving a voltage signal smaller than a potential of the top gate of the fourth transistor T1 on the bottom gate of the fourth transistor T1, a threshold voltage of the fourth transistor T1 may be adjusted to bias positively. Not only does the threshold voltage of the fourth transistor T1 obtain a large range of positive bias, and limitation on a range of the threshold voltage of the fourth transistor T1 is lifted, but on-state current of the fourth transistor T1 in a turn-off state is reduced, so that a high potential of the fourth node P is improved and stabilized.

In an embodiment, when the fourth transistor T1 is in a turn-off state, the potential of the second node K is a negative potential, so that a constant voltage or a potential of a voltage signal having two negative pulses in one frame is lower than a negative potential of the second node K. The threshold voltage of the fourth transistor T1 may be adjusted to bias positively. This can not only reduce the leakage current, but improve and stabilize a high potential of the fourth node P.

In an embodiment, the low potential line transmits a low potential signal VGL. When the voltage signal is a constant-voltage signal, the voltage signal is the low potential signal VGL. A low potential signal VGL with a fixed voltage in the low potential line can also reduce the leakage current of the fourth transistor T1, and may further improve and stabilize a high potential of the fourth node P. In addition, the low potential line may be further shared, and a quantity of traces of the gate drive circuit can be reduced.

In an embodiment, when the voltage signal has two negative pulses in one frame, the voltage signal originates from the second node K or a first node, namely, O[N+1], in a next-stage shift register.

It should be noted that under control of a potential of the second node K with two negative pulses or the first node, namely, O[N+1], in the next-stage shift register, the leakage current of the fourth transistor T1 can also be reduced, and the high potential of the fourth node P can be further improved and stabilized. In addition, the second node K or the first node, namely, O[N+1], in the next-stage shift register may be further shared, and a quantity of external traces of the gate drive circuit can be reduced.

In an embodiment, the voltage signal is further used for adjusting the threshold voltage of the fourth transistor T1 to bias positively and to be greater than 0 V. This may further define a range of positive bias of the threshold voltage of the fourth transistor T1, so that the leakage current can be further reduced, and the high potential of the fourth node P can be further improved and stabilized.

In an embodiment, a voltage transmission line configured to transmit the voltage signal is electrically connected to the first node, namely, O[N+1], in the next-stage shift register.

It should be noted that an advantage of settings is that not only signal frequencies of the fifth node N and the first node O[N+1] in the next-stage shift register are same, but because there is no voltage division effect of a pull-up control transistor T2, a voltage of O[N+1] may be lower, so that the leakage current can be further reduced, and the high potential of the fourth node P or the Nth-stage positive pulse gate drive signal Nout[N] can be further improved and stabilized.

In conclusion, when a potential of the fifth node N is −3 V, the voltage of O[n+1] is −8 V, the bottom gate of the second transistor T10 and/or the fourth transistor T1 is subject to a bias voltage of −8 V, and the Vth of the second transistor T10 and/or the fourth transistor T1 biases positively to 2.5 V at this time. Compared with a design of the structure shown in FIG. 5, a range of positive bias of the threshold voltage may be increased by 2 V, so that reliability of the gate drive circuit is further improved.

It should be noted that for the other description of the gate drive circuit shown in FIG. 11, refer to the detailed description of the gate drive circuit shown in FIG. 3 in the patent application with Application NO. 202310922942.4 or the detailed description of the gate drive circuit shown in FIG. 5 in the patent application with Application NO. 202310922942.4.

Figure 12:
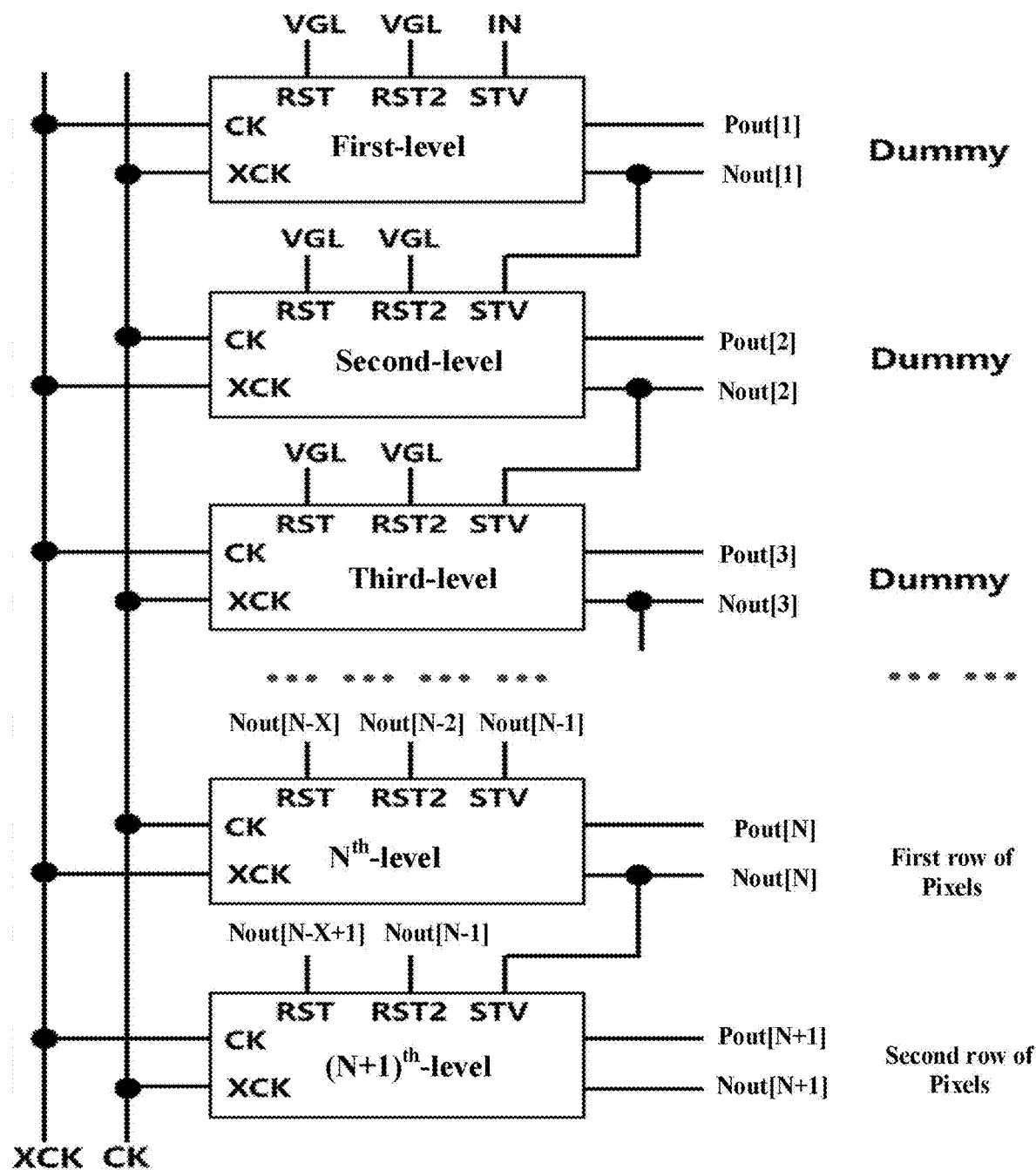
FIG. 12 is a schematic diagram of a structure of a cascade connection between shift registers in the gate drive circuit shown in FIG. 3 or FIG. 5.

FIG. 12 is a schematic diagram of a structure of a cascade connection between different shift registers in the gate drive circuits shown in FIG. 3, FIG. 5, or FIG. 11. A first-stage shift register, a second-stage shift register, a third-stage shift register, . . . , an Nth-stage shift register, an (N+1)th-stage shift register, . . . , and the like are arranged from top to bottom. Each shift register works based on a received first clock signal XCK and a received second clock signal CK separately.

A control end of a first filter module 30 and a control end of a second filter module 80 in the first-stage shift register both receive low potential signals VGL. An input end (IN) of the first-stage shift register connected to a start control line receives a start control signal STV. The first-stage shift register outputs a corresponding first-stage negative pulse gate drive signal Pout[1] and first-stage positive pulse gate drive signal Nout[1]. The first-stage negative pulse gate drive signal Pout[1] and the first-stage positive pulse gate drive signal Nout[1] are used for driving a dummy pixel (Dummy) or are floating.

A control end of a first filter module 30 and a control end of a second filter module 80 in the second-stage shift register both receive low potential signals VGL. A start control line connected to the second-stage shift register receives a cascade signal, namely, the first-stage positive pulse gate drive signal Nout[1]. The second-stage shift register outputs a corresponding second-stage negative pulse gate drive signal Pout[2] and second-stage positive pulse gate drive signal Nout[2]. The second-stage negative pulse gate drive signal Pout[2] and the second-stage positive pulse gate drive signal Nout[2] are used for driving a dummy pixel (Dummy) or are floating.

A control end of a first filter module 30 and a control end of a second filter module 80 in the third-stage shift register both receive low potential signals VGL. A start control line connected to the third-stage shift register receives a cascade signal, namely, the second-stage positive pulse gate drive signal Nout[2]. The third-stage shift register outputs a corresponding third-stage negative pulse gate drive signal Pout[3] and third-stage positive pulse gate drive signal Nout[3]. The third-stage negative pulse gate drive signal Pout[3] and the third-stage positive pulse gate drive signal Nout[3] are used for driving a dummy pixel (Dummy) or are floating.

Others may be deduced in sequence, until a control end of a first filter module 30 and a control end of a second filter module 80 in the Nth-stage shift register respectively receive an (N−X)th-stage positive pulse gate drive signal Nout[N−X] and an (N−2)th-stage positive pulse gate drive signal Nout[N−2] in sequence. A start control line connected to the Nth-stage shift register receives a cascade signal, namely, an (N−1)th-stage positive pulse gate drive signal Nout[N−1]. The Nth-stage shift register outputs a corresponding Nth-stage negative pulse gate drive signal Pout[N] and Nth-stage positive pulse gate drive signal Nout[N]. The Nth-stage negative pulse gate drive signal Pout[N] and the Nth-stage positive pulse gate drive signal Nout[N] are used for driving a first row of pixel circuits (Pixel).

A control end of a first filter module 30 and a control end of a second filter module 80 in an (N+1)th-stage shift register respectively receive an (N−X+1)th-stage positive pulse gate drive signal Nout[N−X+1] and an (N−1)th-stage positive pulse gate drive signal Nout[N−1] in sequence. A start control line connected to the (N+1)th-stage shift register receives a cascade signal, namely, the Nth-stage positive pulse gate drive signal Nout[N]. The (N+1)th-stage shift register outputs a corresponding (N+1)th-stage negative pulse gate drive signal Pout[N+1] and (N+1)th-stage positive pulse gate drive signal Nout[N+1]. The (N+1)th-stage negative pulse gate drive signal Pout[N+1] and the (N+1)th-stage positive pulse gate drive signal Nout[N+1] are used for driving a second row of pixel circuits (Pixel).

Other subsequent shift registers may be deduced in sequence. It should be noted that because output ends of some shift registers are connected to dummy pixels or are floating, output ends of the Nth-stage shift register are not connected to an Nth row of pixel circuits, but a quantity of rows of pixel circuits need to be determined based on a quantity of shift registers that are connected to dummy pixels or are floating. For example, if the first-stage to third-stage shift registers are connected to dummy pixels, output ends of the Nth-stage shift register are connected to an (N−3)th row of pixel circuits.

Figure 13:
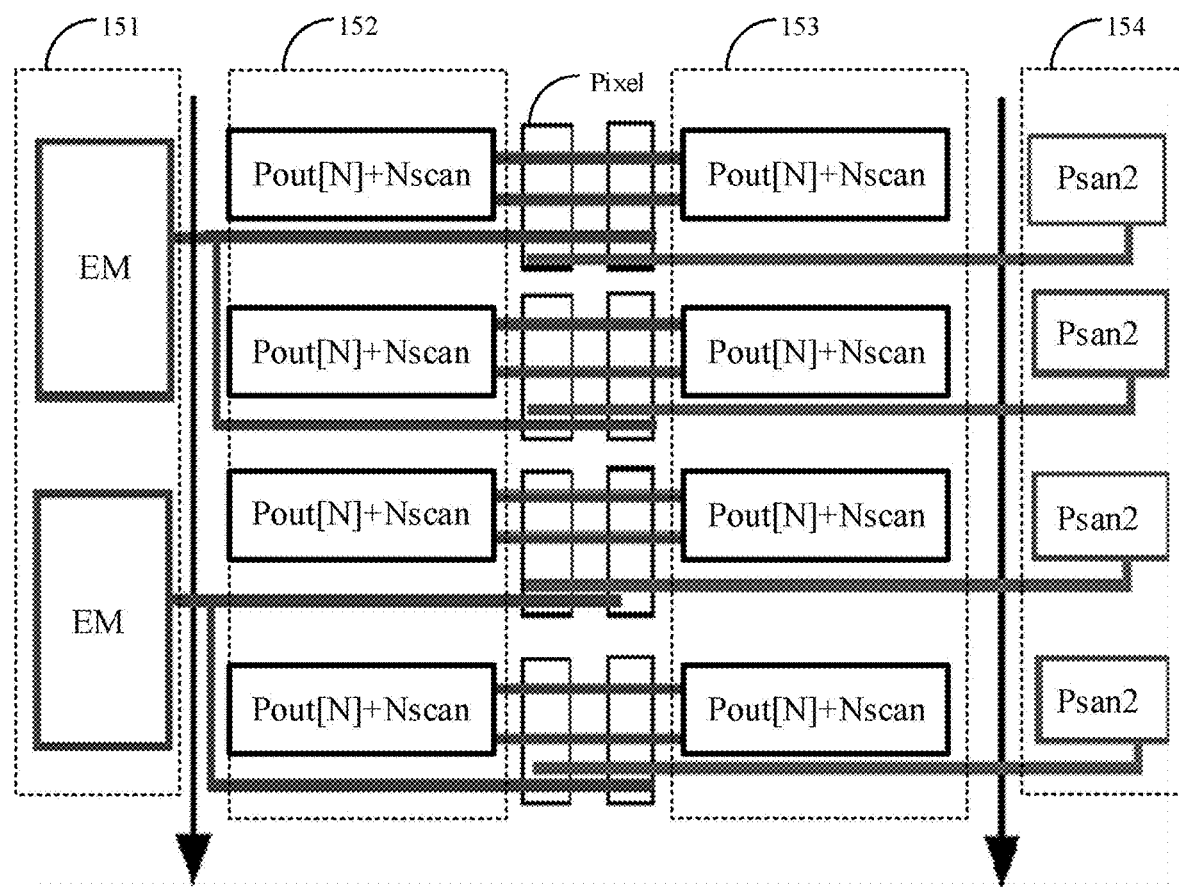
FIG. 13 is a schematic diagram of a structure of a display panel according to an embodiment of the present disclosure.

A display panel shown in FIG. 13 includes a plurality of pixel circuits (Pixel) located on a display area in an array, a first gate drive circuit 151 that provides a light-emitting control signal EM, a fourth gate drive circuit 154 that provides a gate drive signal Pscan2, a second gate drive circuit 152 that provides an Nth-stage negative pulse gate drive signal Pout[N] and a gate drive signal Nscan, and a third gate drive circuit 153 that provides an Nth-stage negative pulse gate drive signal Pout[N] and a gate drive signal Nscan.

The first gate drive circuit 151 may be located on a left side of the display area. An output end of each shift register in the first gate drive circuit 151 provides a light-emitting control signal EM based on a corresponding light-emitting control line and two adjacent rows of pixel circuits. This belongs to unilateral drive.

The fourth gate drive circuit 154 may be located on a right side of the display area. An output end of each shift register in the fourth gate drive circuit 154 provides the gate drive signal Pscan2 by a corresponding gate drive line and a row of pixel circuits. This belongs to unilateral drive.

The second gate drive circuit 152 is located between the first gate drive circuit 151 and the display area. The third gate drive circuit 153 is located between the fourth gate drive circuit 154 and the display area. A gate drive line transmitting the Nth-stage negative pulse gate drive signal Pout[N] is electrically connected to an output end of a shift register in the second gate drive circuit 152, an output end of a shift register in the third gate drive circuit 153, and a row of pixel circuits. A gate drive line transmitting the gate drive signal Nscan is electrically connected to an output end of a shift register in the second gate drive circuit 152, an output end of a shift register in the third gate drive circuit 153, and a row of pixel circuits. This belongs to bilateral drive.

Both the second gate drive circuit 152 and the third gate drive circuit 153 may use the gate drive circuit shown in FIG. 3, FIG. 5, or FIG. 11. The gate drive signal Nscan may include an Nth-stage positive pulse gate drive signal Nout[N] and an (N−3)th-stage positive pulse gate drive signal Nout[N−3].

Because there is a necessary reason that the gate of the first initialization transistor T4P in the pixel circuit shown in FIG. 1 receives the (N−1)th-stage positive pulse gate drive signal Nout[N−1], after the gate of the write transistor T2P in the pixel circuit shown in FIG. 1 receives the Nth-stage negative pulse gate drive signal Pout[N], and the gate of the compensation transistor T3P receives the Nth-stage positive pulse gate drive signal Nout[N], not only can the gate of the third initialization transistor T8P continue to use the existing gate drive signal Pscan2 (no need to improve the fourth gate drive circuit 154), but the gate of the first initialization transistor T4P may also be replaced with the (N−3)th-stage positive pulse gate drive signal Nout[N−3].

Figure 14:
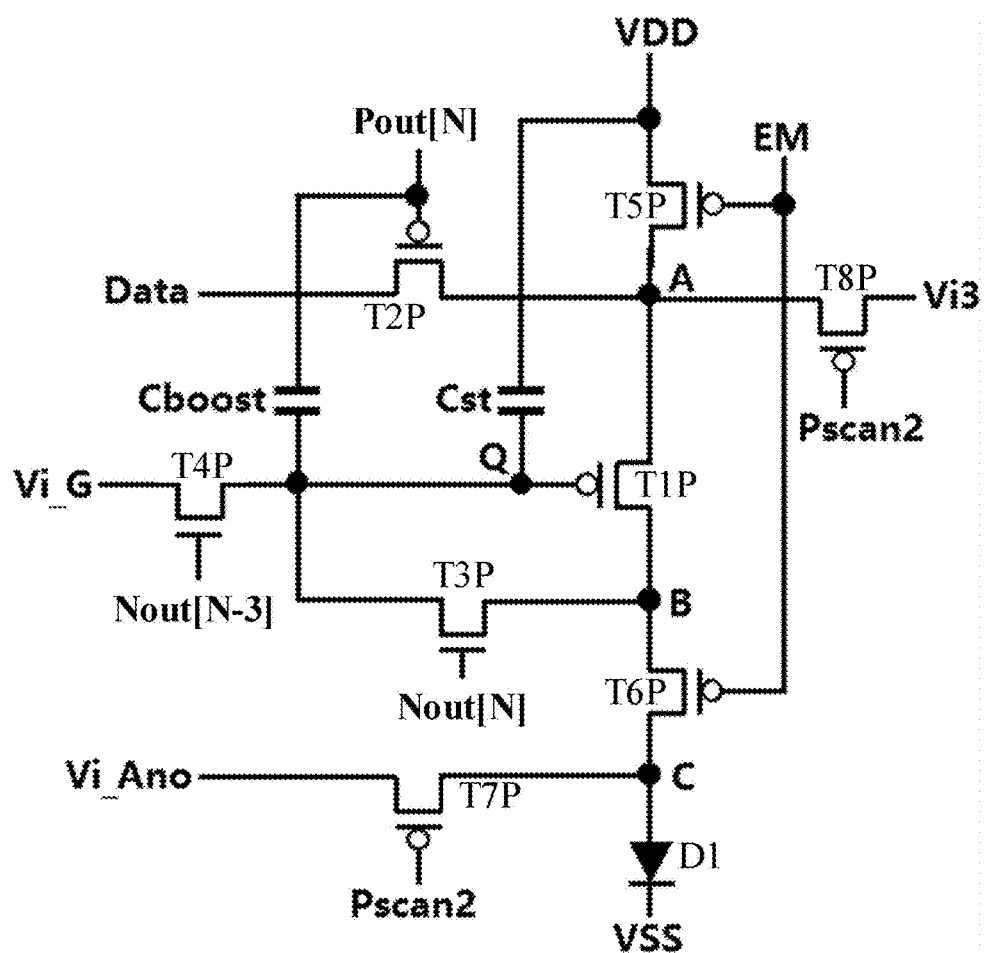
FIG. 14 is a schematic diagram of a structure of a pixel circuit according to an embodiment of the present disclosure.
Figure 15:
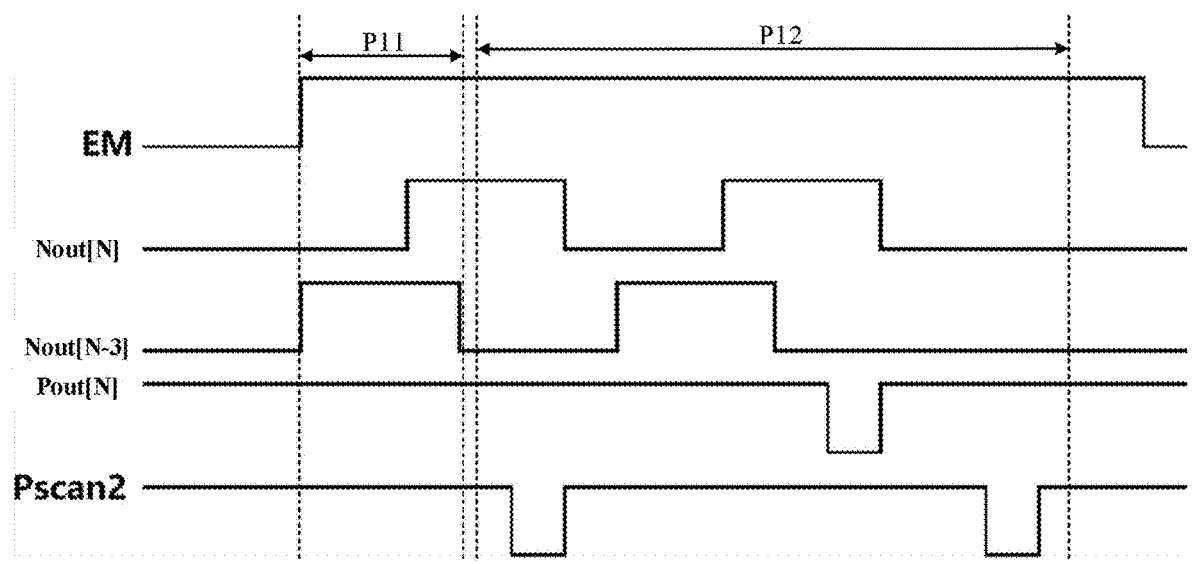
FIG. 15 is a schematic diagram of timing of the pixel circuit in FIG. 14.

In this way, the pixel circuit shown in FIG. 1 may not only work in an existing stage P12 in FIG. 14 in one frame, but may further additionally add a stage P11. In the stage P11, potentials of three ends (Q, A, and B) of the drive transistor T1P is reset by turning on the first initialization transistor T4P and the compensation transistor T3P synchronously, to reduce shift of a threshold voltage of the drive transistor T1P, so that flickering at different refresh frequencies can be alleviated.

In an embodiment, the present embodiment provides a display panel. The display panel includes the gate drive circuit in at least one of the foregoing embodiments and a plurality of pixel circuits.

It may be understood that because the display panel provided in the present embodiment includes the gate drive circuit in at least one of the foregoing embodiments, by receiving a voltage signal smaller than a potential of the top gate of the second transistor T10 on the bottom gate of the second transistor T10, a threshold voltage of the second transistor T10 may be also adjusted to bias positively. Not only does the threshold voltage of the second transistor T10 obtain a large range of positive bias, and limitation on a range of the threshold voltage of the second transistor T10 is lifted, but on-state current of the second transistor T10 in a turn-off state is reduced, so that a high potential of a second gate drive signal output by the second output module 70 is improved and stabilized.

In the foregoing embodiments, the descriptions of the embodiments have different focuses. For a part that is not detailed in an embodiment, reference may be made to the relevant description of other embodiments.

The gate drive circuit and the display panel provided in the embodiments of the present disclosure are described in detail above in detail. Although the principles and implementations of the present disclosure are described by using specific examples in this specification, the descriptions of the foregoing embodiments are merely intended to help understand the technical solutions and the core idea of the present disclosure. A person of ordinary skill in the art should understand that modifications may still be made to the technical solutions described in the foregoing embodiments, or equivalent replacements may be made to some technical features; and these modifications or replacements will not cause the essence of corresponding technical solutions to depart from the scope of the technical solutions in the embodiments of the present disclosure.

What is claimed is:

1. A gate drive circuit, wherein the gate drive circuit comprises a plurality of shift registers, and an Nth-stage shift register of the plurality of shift registers comprises:
   a stage transmission signal selection module, wherein the stage transmission signal selection module is electrically connected between a first node and a first wire;
   a pull-up control module, wherein the pull-up control module controls a potential of a second node based on a potential of the first node and a potential of a first clock signal;
   a first filter module, wherein the first filter module is electrically connected between the second node and a third node, and a control end of the first filter module receives a reset signal;
   a second filter module, wherein the second filter module is electrically connected between the first filter module and the third node, and a control end of the second filter module receives a filter control signal;
   a first output module, wherein the first output module outputs a corresponding first gate drive signal based on a potential of the third node and a potential of a fourth node;
   a first inverting module, wherein the first inverting module is electrically connected between the second node and the fourth node;
   an isolation module, wherein the isolation module is connected between the second node and a fifth node in series, and a control end of the isolation module receives the first clock signal; and
   a second output module, wherein the second output module comprises:
   a first transistor, wherein a first electrode of the first transistor is electrically connected to a high potential line, a gate of the first transistor is electrically connected to the fifth node, a second electrode of the first transistor outputs a corresponding second gate drive signal, and the first transistor is a P-channel transistor; and
   a second transistor, wherein the second transistor is an N-channel transistor, a first electrode of the second transistor is electrically connected to the second electrode of the first transistor, a second electrode of the second transistor is electrically connected to a low potential line, a top gate of the second transistor is electrically connected to the fifth node, and a bottom gate of the second transistor receives a voltage signal smaller than a potential of the fifth node.

2. The gate drive circuit as claimed in claim 1, wherein the voltage signal is a constant-voltage signal, or the voltage signal has two negative pulses in one frame.

3. The gate drive circuit as claimed in claim 2, wherein when the voltage signal is a constant-voltage signal, the voltage signal originates from the low potential line.

4. The gate drive circuit as claimed in claim 2, wherein when the voltage signal has two negative pulses in one frame, the voltage signal originates from the second node or a first node in a next-stage shift register of the plurality of shift registers.

5. The gate drive circuit as claimed in claim 1, wherein the voltage signal is used for adjusting a threshold voltage of the second transistor to bias positively.

6. The gate drive circuit as claimed in claim 5, wherein the voltage signal is further used for adjusting the threshold voltage of the second transistor to be greater than 0 V.

7. The gate drive circuit as claimed in claim 1, wherein the first inverting module comprises:
   a third transistor, wherein a first electrode of the third transistor is electrically connected to the high potential line, a gate of the third transistor is electrically connected to the second node, a second electrode of the third transistor is electrically connected to the fourth node, and the third transistor is a P-channel transistor; and
   a fourth transistor, wherein the fourth transistor is an N-channel transistor, a first electrode of the fourth transistor is electrically connected to the second electrode of the third transistor, a second electrode of the fourth transistor is electrically connected to the low potential line, a top gate of the fourth transistor is electrically connected to the second node, and a bottom gate of the fourth transistor receives the voltage signal smaller than the potential of the second node.

8. The gate drive circuit as claimed in claim 7, wherein the voltage signal is a constant-voltage signal, or the voltage signal has two negative pulses in one frame.

9. The gate drive circuit as claimed in claim 8, wherein the low potential line transmits a low potential signal, and when the voltage signal is a constant-voltage signal, the voltage signal is the low potential signal.

10. The gate drive circuit as claimed in claim 8, wherein when the voltage signal has two negative pulses in one frame, a potential of the voltage signal is the potential of the second node or a potential of a first node in a next-stage shift register of the plurality of shift registers.

11. The gate drive circuit as claimed in claim 7, wherein the voltage signal is further used for adjusting a threshold voltage of the fourth transistor to bias positively and to be greater than 0 V.

12. A display panel, wherein the display panel comprises:
   a pixel circuit, wherein the pixel circuit comprises a write transistor controlling input of a data signal and a compensation transistor controlling the data signal to be input into a gate of a drive transistor; and
   a gate drive circuit, wherein the gate drive circuit comprises a plurality of shift registers, and an Nth-stage shift register of the plurality of shift registers comprises:
      a stage transmission signal selection module, wherein the stage transmission signal selection module is electrically connected between a first node and a first wire;
      a pull-up control module, wherein the pull-up control module controls a potential of a second node based on a potential of the first node and a potential of a first clock signal;
      a first filter module, wherein the first filter module is electrically connected between the second node and a third node, and a control end of the first filter module receives a reset signal;
      a second filter module, wherein the second filter module is electrically connected between the first filter module and the third node, and a control end of the second filter module receives a filter control signal;
      a first output module, wherein the first output module outputs a corresponding first gate drive signal based on a potential of the third node and a potential of a fourth node;
      a first inverting module, wherein the first inverting module is electrically connected between the second node and the fourth node;
      an isolation module, wherein the isolation module is connected between the second node and a fifth node in series, and a control end of the isolation module receives the first clock signal; and
      a second output module, wherein the second output module comprises:
         a first transistor, wherein a first electrode of the first transistor is electrically connected to a high potential line, a gate of the first transistor is electrically connected to the fifth node, a second electrode of the first transistor outputs a corresponding second gate drive signal, and the first transistor is a P-channel transistor; and
         a second transistor, wherein the second transistor is an N-channel transistor, a first electrode of the second transistor is electrically connected to the second electrode of the first transistor, a second electrode of the second transistor is electrically connected to a low potential line, a top gate of the second transistor is electrically connected to the fifth node, and a bottom gate of the second transistor receives a voltage signal smaller than a potential of the fifth node,
      wherein an output end of the first output module is electrically connected to a gate of the write transistor, and an output end of the second output module is electrically connected to a gate of the compensation transistor.

* * * * *